US005574285A

United States Patent [19]
Marion et al.

[11] Patent Number: 5,574,285
[45] Date of Patent: Nov. 12, 1996

[54] ELECTROMAGNETIC RADIATION DETECTOR AND ITS PRODUCTION PROCESS

[75] Inventors: François Marion, Saint Egreve; Angelo Guiga, Tullins; Michelle Boitel, Fontaine; Gilbert Gaude, Noyarey, all of France

[73] Assignee: Commissariat a L'Energie Atomique, France

[21] Appl. No.: 368,624

[22] Filed: Jan. 4, 1995

[30] Foreign Application Priority Data

Jan. 7, 1994 [FR] France ................................. 94 00115

[51] Int. Cl.$^6$ .......................................................... G01J 5/20
[52] U.S. Cl. ................................. 250/370.13; 250/338.1; 437/3
[58] Field of Search ........................ 250/370.13, 370.12, 250/370.14, 338.1, 338.4, 338.3; 437/3

[56] References Cited

U.S. PATENT DOCUMENTS

| 4,354,109 | 10/1982 | Gelpey et al. | 250/338.3 |
| 5,030,828 | 7/1991 | Solomon | 250/370.13 |
| 5,264,699 | 11/1993 | Barton et al. | 250/370.13 |
| 5,308,980 | 5/1994 | Barton | 250/338.4 |

Primary Examiner—Davis L. Willis
Assistant Examiner—Richard Hanig
Attorney, Agent, or Firm—Hayes, Soloway, Hennessey, Grossman & Hage, P.C.

[57] ABSTRACT

Electromagnetic radiation detector and its production process. The detector comprises a thin detection material film (8), which is sensitive to the radiation to be detected and which has a first and a second faces (10, 12), the first face being directly exposed to the radiation to be detected, a resin coating (18) surrounding the thin detection material film (8) and having a lip (20) which projects beyond the first face (10) of the thin film (8).

14 Claims, 4 Drawing Sheets

ELECTROMAGNETIC RADIATION DETECTOR AND ITS PRODUCTION PROCESS

DESCRIPTION

1. Technical Field

The invention relates to an electromagnetic radiation detector and to a process for the production of such a sensor.

A spectral range to which the invention more particularly relates is the infrared, the detector then being an infrared sensor.

Thus, the invention has applications in the field of optoelectronics, particularly infrared optoelectronics.

2. Prior Art

The circuits and components for the detection of electromagnetic radiation, particularly in the infrared, must often be used at low temperatures, between 4 and 200 K and more particularly at about 77 K, in order to minimize the background noise which is superimposed on the signal, when the latter is at a relatively low level (e.g. photon counting conditions). This is in particular the case for detectors operating in the infrared range.

However, the materials from which said detectors are made, together with the structure thereof, are not always compatible with low temperature deviations. In particular, different materials can be used for the different parts of the detector and said materials do not all have identical or similar heat expansion coefficients. Therefore, sometimes deformations occur, which can be of a significant level and can even lead to mechanical breaks after a few drops to low temperatures.

This is particularly the case for infrared (I.R.) radiation detectors obtained by the hybridization of an I.R. detector material layer on a silicon circuit. The hybridization method used can e.g. be the so-called flip chip hybridization method using bumps. A detector obtained by such a method has the structure illustrated in FIG. 1.

Figure 1:
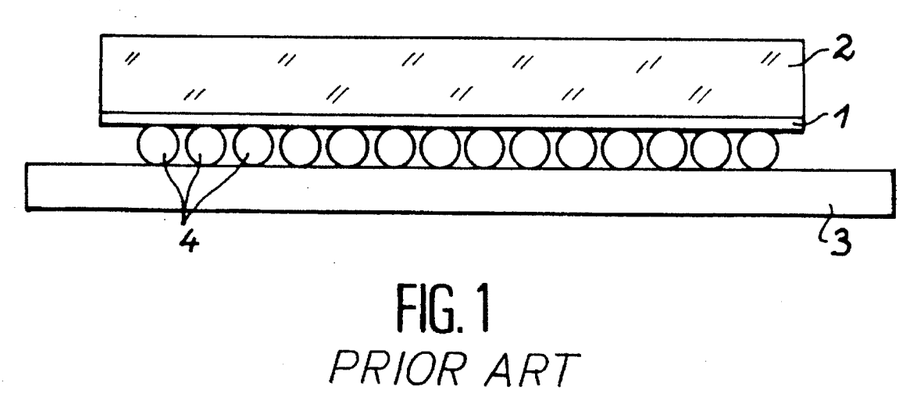
FIG. 1, already described, a prior art radiation detector.

In FIG. 1, reference numeral 1 designates a layer of a material sensitive to the electromagnetic radiation to be detected, e.g. CdHgTe for the infrared. This layer is deposited on a substrate 2 which is transparent to the radiation to be measured. In the case of a CdHgTe layer, the substrate can be of CdTe. Photodetection elements can be of the photovoltaic or photoconductive type (e.g. P/N diodes) and are produced on said CdHgTe layer. Reference numeral 3 designates a silicon circuit used for reading the electric signal obtained. The assembly of the detector material layer and the substrate is hybridized on the reading silicon with the aid of balls or bumps 4. The size of said bumps is a few dozen micrometres and the hybridization process is described in the prior art, e.g. in FR-A-89 05542 of Apr. 26 1989 (U.S. Pat. No. 5,131,584).

Figure 2:
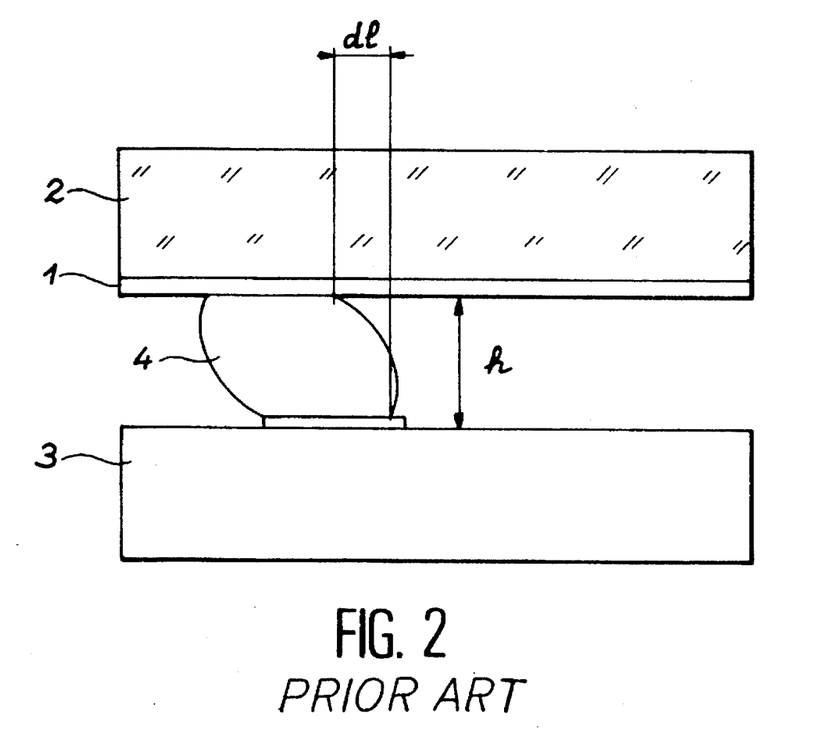
FIG. 2, already described, the shear phenomenon occurring in the prior art detector.

FIG. 2 illustrates the physical phenomenon occurring during low temperature deviations. In FIG. 2, references 1 to 4 have the same meaning as in FIG. 1. If h represents the height of a bump (equal to the distance between the face of the detector material layer turned towards the silicon and the surface of the latter), 1 is the distance of the bump in question from the centre of gravity of the group of bumps, $\Delta\alpha$ the difference between the expansion coefficient of silicon and that of the detection material, $\Delta T$ the amplitude of the temperature deviation, the bumps undergoing a shear $d1$ such that $$\frac{dl}{h} = 1\Delta\alpha\Delta T.$$

For example, for a detector material based on cadmium tellurium, there is a differential expansion of 6 µm/cm between the silicon and said material when the temperature varies between 373 and 77 K. A bump located 1 cm from the geometrical centre of a component will therefore undergo a lateral deformation of 6 um, i.e. for a bump of height h=20 µm, there is a relative deformation of $$\frac{dl}{h} = \frac{6}{20} = 30\%,$$

which is considerable.

This type of problem has already occurred in another technical field, namely that of electronic components, where such flip clip hybridized structures are also encountered.

A first type of solution in this field consists of increasing the height h between two hybridized surfaces in order to limit the relative deformation $$\frac{dl}{h}.$$

This result is obtained by stacking the bump layers. This process is described in an article by N. Matsui et al entitled "VLSI chip interconnection technology using stacked solder bumps", published in IEEE Transactions on Components, Hybrids and Manufacturing Technology, vol. 12, No. 4, December 1987. However, this method is difficult to perform and the tests carried out on these structures have not used temperatures below −70° C. (It is pointed out that the problem referred to hereinbefore concerns deviations as low as 4 K, i.e. approximately −269° C.).

Moreover, it does not make it possible to definitively eliminate the problems connected with the failure of the bumps and instead only delays such a failure occurring.

Another process for improving the mechanical strength of hybridized electronic circuits is known from and explained in the article entitled "Development of a high reliability flip chip packaging reinforced by resin", published in "Electronics and Communications in Japan", part 2, vol. 71, No. 11, 1988, p 19 and in the document "Flip chip solder bump fatigue life enhanced by polymer encapsulation" published in "Proceedings of the 40th Electronic Components and Technology Conference", 1990, p 338.

The process described in these documents involves coating the electronic components. This process consists of depositing a calibrated drop of a coating substance such as a coating resin (more simply referred to hereinafter as resin). This calibrated resin drop is deposited close to the flip chip or bump hybridized electronic component, which is in most cases an electronic chip. The resin droplet deposited close to the electronic component migrates by capillarity beneath the latter, i.e. said resin droplet migrates towards the bumps of the hybridized component located between said component and the substrate. The resin droplet must be correctly calibrated in such a way that the resin quantity which it contains is sufficiently large to fill completely the space between the hybridized component and the substrate, but must not be too large, so that the resin is not excessively spread around said hybridized component. Moreover, in order to avoid said undesired "spreading" of the resin around the hybridized component, the resin droplet must be very accurately deposited on the edge of the hybridized component. Thus, if the resin droplet has an excessive volume, the resin may spread widely around the component, so as to cover areas close to the component and which should not be covered. Therefore, this procedure is relatively difficult to perform. In addition, the components obtained are designed to drop to temperatures of approximately −55° C., but not below this. However, the starting problem for the present invention concerns temperatures as low as 4 K (i.e. approximately −269° C.), for which it is not possible to use the prior art solution.

DESCRIPTION OF THE INVENTION

The present invention aims at obviating these disadvantages by improving the structure of the electromagnetic radiation detector.

More specifically, the present invention relates to an electromagnetic radiation detector comprising a thin detector material film sensitive to the electromagnetic radiation to be detected, said film having a first face and a second face, the first face being directly exposed to the radiation to be detected, a resin coating surrounding the detector material film sensitive to the electromagnetic radiation to be detected, in contact with the second face of the thin detector material film and having a lip which projects beyond the first face of the thin film.

According to a preferred embodiment of the invention, said detector is also characterized in that the thin detector material film is hybridized by microbumps on a reading circuit.

Preferably, the lip of the resin coating has a planar surface.

The radiation to be detected can be an infrared radiation, the material constituting the thin film then being based on CdHgTe.

Finally, according to another embodiment of the invention, the aforementioned detector is also characterized in that the resin has a heat expansion coefficient close to that of the material constituting the reading circuit.

The invention also relates to a process for the production of an electromagnetic radiation detector having the following stages:

- a stage of depositing a detection material film, which is sensitive to the radiation to be detected, on a substrate,
- a stage of coating by a resin the assembly constituted by the substrate and the thin film of material sensitive to the radiation to be detected, so that the film is between the resin and the substrate,
- a stage of mechanical thickness reduction of the assembly constituted by the resin and the substrate,
- a stage of chemical thickness reduction of the substrate.

According to a preferred embodiment of the process according to the invention, said process also involves a stage of hybridizing the thin detection film, with the aid of microbumps, on to a reading circuit.

Advantageously, the chemical thickness reduction stage consists of impregnating the thin film-substrate assembly in a chemical bath saving all the constituents of the circuit, with the exception of the material forming the substrate. The reading circuit can be produced on a silicon wafer.

Between the deposition of the film of material sensitive to the radiation to be detected on the substrate and the coating by a resin, the process can have a cutting stage with respect to the substrate-thin film assembly, so as to form individual photodetection circuits, the hybridization stage, the coating stage and the two thickness reducing stages being performed collectively.

The characteristics and advantages of the invention will become more apparent from the following description relating to a number of exemplified embodiments given in an explanatory and non-limitative manner, relative to the attached drawings, wherein show.

Figure 3:
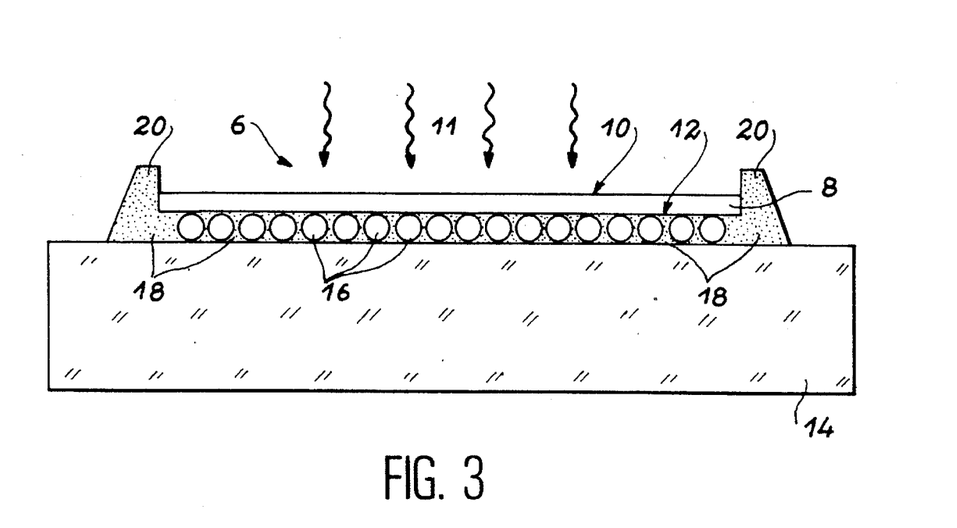
FIG. 3 a detector according to the invention.

FIG. 3 shows a detector 6 having a film or layer 8 of material sensitive to an electromagnetic radiation having given characteristics. This film has a first face 10 (directed upwards in FIG. 3) and a second face 12 (directed downwards in FIG. 3). The radiation 11 to be measured arrives directly on the first face 10.

This detector material film is hybridized on a reading circuit 14, e.g. of silicon, hybridization taking place with microbumps 16, of the type used in hybridized compounds in microelectronics.

These bumps can e.g. be produced by the electrolytic growth of a film of a material having a low melting point (e.g. Sn-Pb or indium) above a wettable surface (e.g. a gold surface) having a smaller surface area. These bumps can then be shaped by melting the material, the surface tension forces forming the bumps welded to the wettable surface. Embodiments of these bumps used for the hybridization of electronic components are described in the documents cited hereinbefore. It is also possible to cite in this connection the work entitled "Microelectronic Packaging Handbook", published by R. R. Tummala et al, pp 361–391.

The detector is coated with a resin 18 covering the second face 12 of the detector material film 8 and which surrounds the latter having a lip 20 projecting forwards beyond the first face 10 of the film. Preferably, said lip has a horizontal portion with respect to the faces of the detector material film and forms a type of table, as shown in FIG. 3.

This detector has a very great stability during deviations or drifts at very low temperatures, because all the bumps are subject to a reduced differential expansion and the problems of external bumps are eliminated.

The lip 20 makes it possible to stabilize the structure and increase the mechanical strength of the assembly during low temperature deviations.

In order to detect a radiation in the infrared, it is e.g. possible to choose a detector material based on CdHgTe. CdHgTe is a ternary component for which the expert will be able to define the stoichiometric ratios, as a function of the specifically envisaged applications.

A process for the production of such a detector will now be described.

1. A first stage involves the collective production of the reading circuits 14 on a silicon wafer, as well as contact blocks 22 on which will rest the bumps 16 necessary for the hybridization stage (cf. FIG. 4). For this purpose use will be made of conventional methods for the collective production of integrated silicon circuits, which will then be provided with bumps for hybridization. A description of a process for the production of such microbumps appears in the book entitled "Microelectronic Packaging Handbook", published by R. R. Tummala et al, p 361–391.

There can be an electrical testing of the silicon reading circuits, followed by a stage of marking the electronic circuits to be hybridized.

2. A second stage which can be performed in parallel with the first is devoted to producing a thin film 8 of material for the detection of the radiation. This thin film is deposited on a substrate 26 by a conventional thin film deposition process, such as epitaxy. In the case of the aforementioned example (detection material=GdHgTe), a choice will e.g. be made of a CdTe substrate, but other materials can be used. Thus, a detector material thin film 8 is obtained which can have a thickness of a few micrometres.

Figure 5:
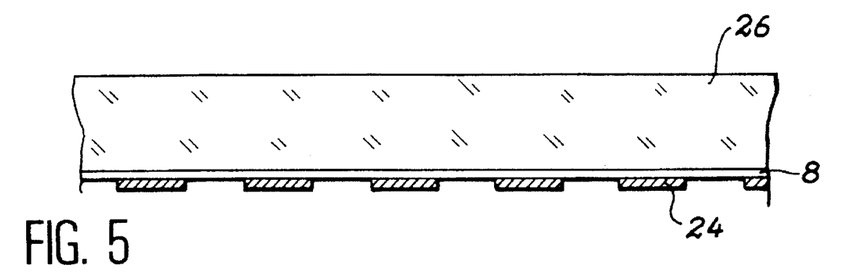
FIG. 5 another stage in the performance of a process for the production of a detector according to the invention.

The contact blocks 24 which will bear on the bumps 16 during the following hybridization stage are then made (FIG. 5). The substrate 26, carrying the film 8 and the blocks 24, is then cut in order to form photodetection circuits.

3. In a third stage, it is then possible to carry out the collective hybridization of the photodetection circuits on the wafer having the reading circuits 14, with the aid of microbumps 16 and the contact blocks 24 and 22.

It is possible to use the hybridization process described in FR-A-89 05542, which can easily be performed in a collective manner.

The material of the bumps 16 will be chosen in such a way that, in the liquid state, it leads to a good wetting of the materials from which the blocks 22 and 24 are made, such as gold, but does not or only very poorly wets the materials constituting the area around said blocks (i.e. the detection film 8 and the reading circuits). Moreover, this process making it necessary to raise the temperature up to the melting point of the bumps, the latter must be made from a material whose melting point is sufficiently low that it does not deteriorate the components during the interconnection thereof.

Bearing in mind these two conditions, a material such as indium, tin or lead or a metal alloy having a low melting point containing one of said materials can be suitable for the bumps 16.

When contacting has taken place between the bumps 16 on the one hand and the contact blocks 22 of the reading circuits 14 and on the other hand with the contact blocks 24 of the face 12 of the film 8 of each of the photodetection circuits, the temperature of the resulting assembly is raised to the melting point of the material constituting the bumps. The assembly is then cooled in a natural manner.

During the heating of the assembly and up to the cooling thereof, one of the components, e.g. the reading circuit 14, is held (it is e.g. placed on a not shown, horizontal support), whilst the photodetection circuits are free, e.g. above the circuit 14.

Figure 4:
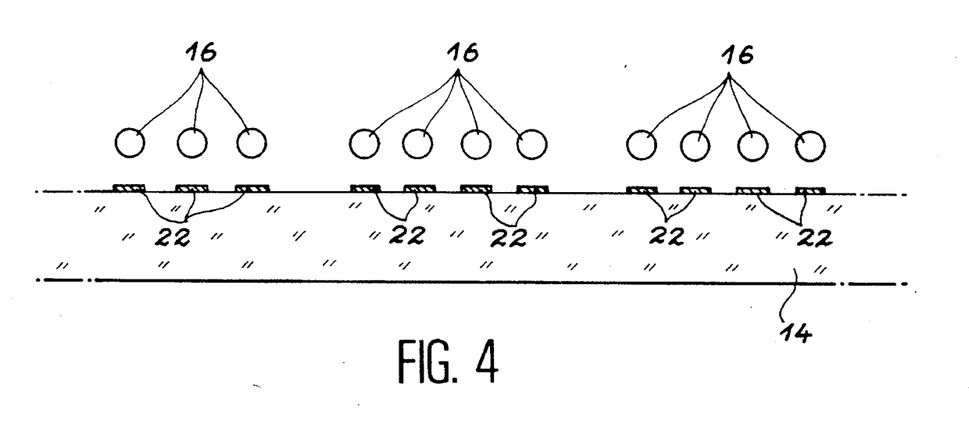
FIG. 4 a stage in performing a process for the production of a detector according to the invention.
Figure 6:
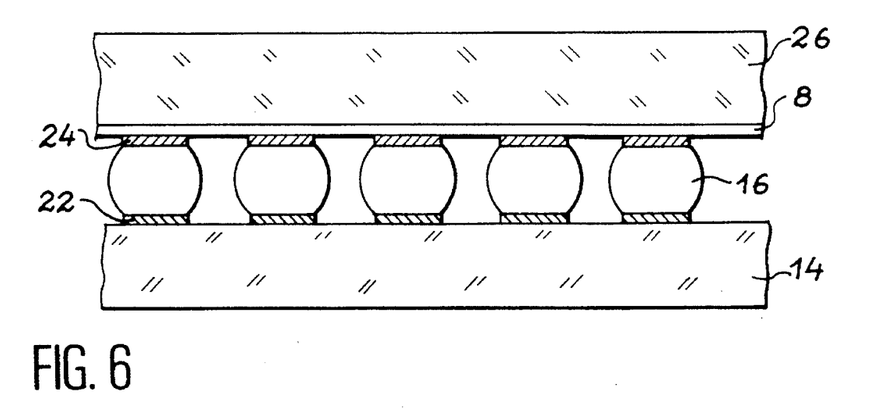
FIG. 6 the component obtained after the microbump hybridization stage.

The assembly obtained by this process is illustrated in FIG. 6, where the references have the same meanings as in FIGS. 4 and 5. A single photodetection circuit is shown in FIG. 6.

This process offers the following advantages:

the interconnection produced is very strong, because there is a welding of the bumps to the contact blocks and the tearing away of two components makes it possible to see that the break occurs after stretching and breaking of the bumps and not at the interfaces between the bumps and the blocks;

the assembly obtained has a very good resistance to ageing, to very low temperature thermal cycles and to vibrations;

the hybridization efficiency is excellent, the wastage level being close to 0, it not being possible to short-circuit the contact blocks because each bump cannot be welded to any element other than the blocks, as a result of the choice of materials;

the putting into operation of this process gives rise to an auto-alignment of the components and therefore only requires a lower alignment precision than that which is necessary with the prior art processes.

4. Each of the thus prepared assemblies (i.e. each detection film on the substrate, hybridized by the bump to the reading circuits of the silicon wafer) is then coated in a resin. The expert can choose a resin having an appropriate viscosity and an expansion coefficient close to silicon.

The coating method is such that the localization of the resin can be controlled during and after the coating of said hybridized component. It can easily be performed in a collective manner, i.e. for the coating of a certain number of hybridized photodetection circuits.

This method consists of placing the bumps on the circuits of the silicon wafer, so as to form a covering of bumps in the vicinity of the hybridized detection film which it is wished to coat and depositing at least one drop of a coating substance (or resin) on the bump covering, the latter, impregnated with substance, being able to make said substance migrate by capillarity towards the other bumps in the covering.

It is preferable to place the bump covering contiguous to the hybridized detection circuit to be coated. In this way, the bumps of the covering ensure the migration of the coating substance towards the bumps positioned between said detector and the silicon reading circuit.

Figure 7A:
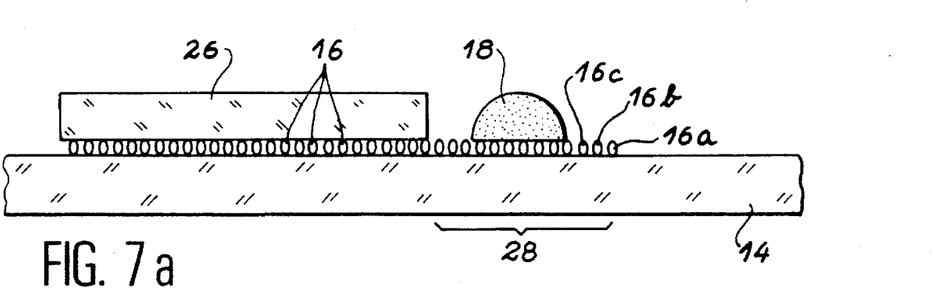
FIGS. 7a and 7b the resin coating stage using a covering of microbumps contiguous to the component to be coated.
Figure 7B:
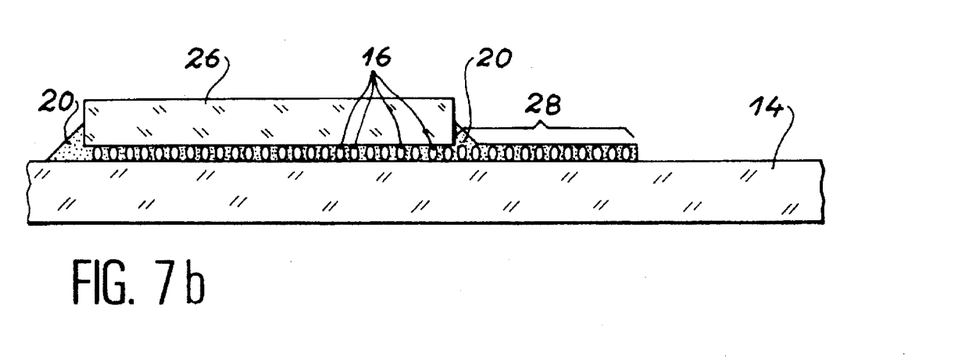

FIGS. 7a and 7b show the detection circuit hybridized on the reading circuits of the silicon wafer 14. A bump covering 28 is produced by means of a plurality of bumps (16a, 16b, 16c, etc.), which are identical to the bumps 16. This bump, covering 28 is arranged contiguous to the bumps 16 of the hybridized detection circuit. A resin droplet 18 is then deposited on the covering 28 (FIG. 7a). The capillarity forces will have the two following effects:

the resin 18 extends to all the bumps of the covering 28, as well as to all the bumps 16 of the surface beneath the photodetection circuit (FIG. 7b);

the resin 18 is retained in the limit of the bump covering, except for a small portion which forms, also under the effect of capillarity forces, a lip 20 on the edges of the photodetection circuit (FIG. 7b).

No matter what the location of the bump covering on which is deposited the resin droplet, the latter is sucked up by the covering and directed towards the contiguous, hybridized photodetection circuit below which it is also sucked. The excess resin dispensed remains confined in the bump covering 28, except for the part forming the lip 20 on the edges.

A resin crosslinking cycle is then carried out in accordance with the specifications for the particular resin used.

5. The subsequent stage is a thickness reduction stage using mechanical means widely used in the electronic components industry (e.g. mechanical grinding).

This stage is intended to:

eliminate the excess coating resin 18 which is able to crack at low temperatures (77 K), perform a first etching of the substrate 26 (e.g. CdTe) on which is deposited the detector material film 8, level the coating resin lips 20 created along the detection circuit during stage 5.

Figure 8:
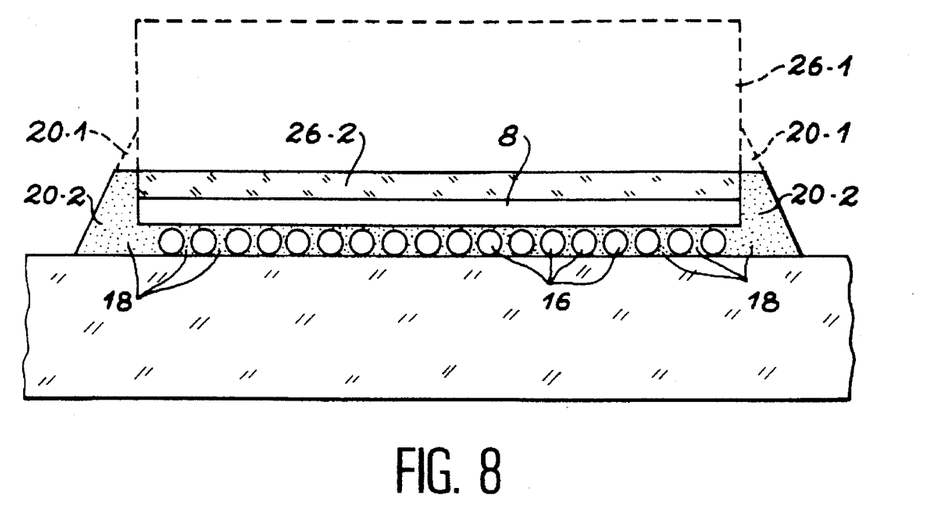
FIG. 8 the component obtained after the mechanical thickness reduction stage.

FIG. 8 illustrates this mechanical thickness reduction stage. In FIG. 8, the references 8, 14, 16 and 18 have the same meanings as in FIG. 3. In dotted line form are shown the portions 26-1 of the substrate 26 and 20-1 of the lip 20, which are eliminated at the end of the mechanical thickness reduction stage. References 26-2 and 20-2 represent the portion of the substrate and the lip remaining intact after said stage.

It is not necessary to achieve a great precision by the mechanical thickness reduction operation. For example, it is possible to accept a height between that of the detection circuit and the silicon surface of 50±20 μm for bump heights of e.g. 10 to 30 μm.

6. A second thickness reduction stage is then performed, but using chemical means. It is intended to remove any substrate residue 26-2 not removed by the mechanical thickness reduction during stage 5 (cf. FIG. 5).

If e.g. the bumps have a height of 20 μm, the detection material film a thickness of 5 μm and the mechanical thickness; reduction has left a residual thickness of 50 μm, it is a question of removing 50−(20+5)=25 μm of substrate.

This substrate residue will be eliminated by immersing the complete silicon wafer carrying the hybridized photodetection circuits in a chemical bath saving all the constituents of the circuit, except the material forming the substrate 26.

This bath will also be very selective regarding the material forming the detection films 8. Such a bath can e.g. be constituted by a mixture of hydrofluoric acid, nitric acid and acetic acid.

This second thickness reduction leaves a "step" between the levelled portion of the resin lip 20 on the periphery of the detector and the detection film material 8. It is this lip 20 which contributes to the mechanical stability of the assembly, during very low temperature deviations.

Following mechanical levelling, the resin and the substrate are at the same height level (cf. FIG. 8). However, after the chemical levelling, the substrate 26 is eliminated, whereas the resin is either not or is less affected by the etching. Each of the thickness reduction stages (mechanical and chemical) is advantageously performed in a collective manner.

Each of the circuits provided with a detector can then be functionally tested.

Figure 9:
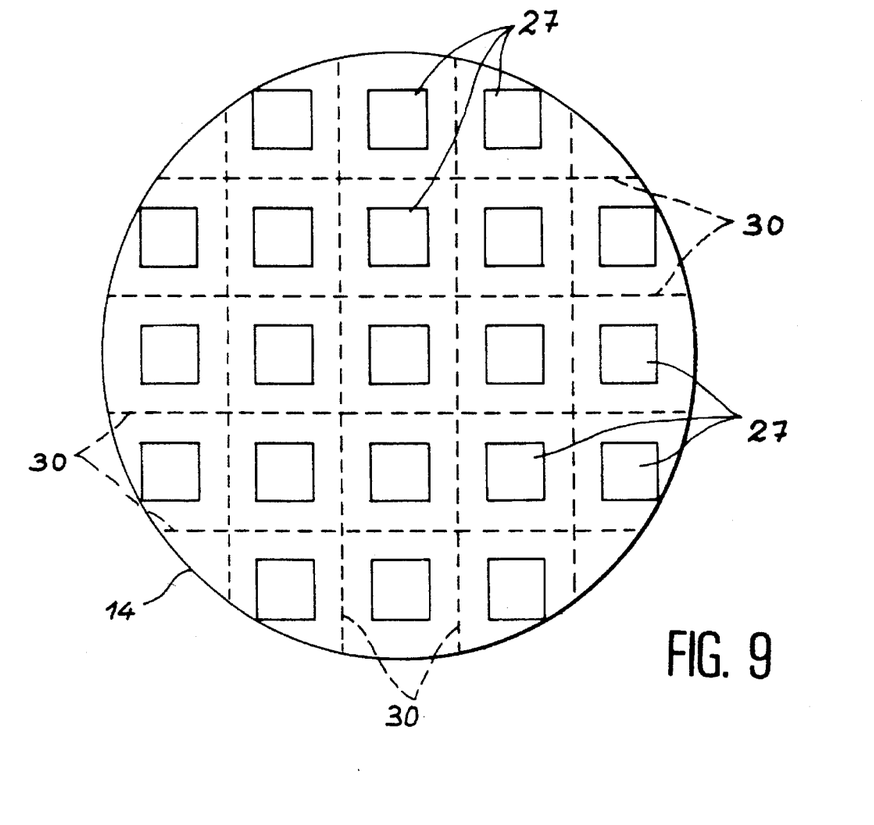
FIG. 9 the final cutting stage of the process.

7. Each of the "reading circuit+detection circuit" components, which has been found to operate in a satisfactory manner by the testing process, can then be treated according to conventional silicon technology process end procedures, namely: cutting the circuits with a rotary saw, so as to give a detector like that shown in FIG. 3. This cutting stage is illustrated in FIG. 9 where reference 27 designates several photodetection circuits, each being hybridized on a reading circuit and coated with resin. The reference 30 designates the cutting lines between the different components and reference 13 the silicon substrate, installation by wire (ball bonding/wedge bonding) in a box and/or a ceramic.

All the stages described makes it possible to treat complete silicon plates or boards and use machines developed for the microelectronics industry (handling, hybridization, coating, mechanical and chemical thickness reduction, cutting, etc.). Moreover, each of the above-described stages can easily be performed in a collective manner, so that it is possible to produce the detectors according to the invention in large numbers and at a reduced cost.

We claim:

1. Hybrid electromagnetic radiation detector comprising a thin detection material film sensitive to the radiation to be detected and having a first and a second faces, the first face being directly exposed to the radiation to be detected, a reading circuit bonded to said second face, and a resin coating surrounding the thin detection material film and having a lip projecting beyond the first face of the thin film.

2. Hybrid electromagnetic radiation detector comprising a thin detection material film sensitive to the radiation to be detected and having a first and a second faces, the first face being directly exposed to the radiation to be detected, a reading circuit bonded to said second face, and a resin coating surrounding the thin detection material film and having a lip projecting beyond the first face of the thin film, the thin detection material film being hybridized by microbumps on said reading circuit.

3. Detector according to claim 1, the lip of the resin coating having a planar surface.

4. Detector according to claim 1, the radiation to be detected being an infrared radiation and the detection material being based on CdHgTe.

5. Detector according to claim 2, the resin having a heat expansion coefficient close to that of the material constituting the reading circuit.

6. Process for the production of a hybrid electromagnetic radiation detector comprising the following stages:

a stage of depositing a detection material film, sensitive to the radiation to be detected, on a substrate, stage of bonding said film to a reading circuit, a stage of coating by a resin the assembly constituted by the reading circuit, the substrate and the thin film of material sensitive to the radiation to be detected, in such a way that the film is located between the resin and the substrate, a stage of mechanical thickness reduction of the assembly constituted by the resin and the substrate and stage of chemical thickness reduction of the substrate.

7. Process for the production of a hybrid electromagnetic radiation detector comprising the following stages:

a stage of depositing a detection material film, sensitive to the radiation to be detected, on a substrate, a stage of bonding said film to a reading circuit, a stage of coating by a resin the assembly constituted by the reading circuit, the substrate and the thin film of material sensitive to the radiation to be detected, in such a way that the film is located between the resin and the substrate, a stage of mechanical thickness reduction of the assembly constituted by the resin and the substrate and stage of chemical thickness reduction of the substrate, and also comprising a stage of hybridizing the thin detection film, with the aid of microbumps, on said reading circuit.

8. Process according to claim 6, the chemical thickness reduction stage comprising the impregnation of the thin film-substrate assembly in a chemical bath saving all the constituents of the circuit with the exception of the material forming the substrate.

9. Process according to claim 7, the reading circuit being produced on a silicon wafer.

10. Process according to claim 9 comprising, between the stage of depositing the material film sensitive to the radiation to be detected on the substrate and the resin coating stage, a stage of cutting the substrate-thin film assembly so as to form individual photodetection circuits, the hybridization stage, the coating stage and the two thickness reduction stages being performed in a collective manner.

11. Process according to claim 10, comprising a stage of cutting the silicon substrate so as to form the individual components, each constituted by a photodetection circuit on a reading circuit.

12. Detector according to claim 2, the lip of the resin coating having a planar surface.

13. Detector according to claim 2, the radiation to be detected being an infrared radiation and the detection material being based on CdHgTe.

14. Process according to claim 7, the chemical thickness reduction stage comprising the impregnation of the thin film-substrate assembly in a chemical bath saving all the constituents of the circuit with the exception of the material forming the substrate.

* * * * *

UNITED STATES PATENT AND TRADEMARK OFFICE
CERTIFICATE OF CORRECTION

PATENT NO. : 5,574,285
DATED : November 12, 1996
INVENTOR(S) : Francois Marion, Angelo Guiga, Michelle Boitel and Gilbert Gaude It is certified that error appears in the above-indentified patent and that said Letters Patent is hereby corrected as shown below:

Claim 6, Column 8, Line 28, before "stage", insert --a--.

Signed and Sealed this

First Day of April, 1997

*Attest:*

BRUCE LEHMAN

*Attesting Officer*  Commissioner of Patents and Trademarks